United States Patent
Daneman et al.

(10) Patent No.: US 6,764,936 B2
(45) Date of Patent: Jul. 20, 2004

(54) MECHANICAL LANDING PAD FORMED ON THE UNDERSIDE OF A MEMS DEVICE

(75) Inventors: Michael J. Daneman, Pacifica, CA (US); Behrang Behin, Berkeley, CA (US); Meng-Hsiung Kiang, Berkeley, CA (US)

(73) Assignee: Onix Microsystems, Inc., Fremone, CA (US)

( * ) Notice: Subject to any disclaimer, the term of this patent is extended or adjusted under 35 U.S.C. 154(b) by 259 days.

(21) Appl. No.: 09/912,150

(22) Filed: Jul. 23, 2001

(65) Prior Publication Data

US 2001/0055831 A1 Dec. 27, 2001

Related U.S. Application Data

(62) Division of application No. 09/546,432, filed on Apr. 10, 2000, now Pat. No. 6,586,841.

(51) Int. Cl.[7] .......................... H01L 21/44; H01L 21/00; H01L 21/46; H01L 21/30
(52) U.S. Cl. ........................... 438/599; 438/50; 438/52; 438/106; 438/108; 438/612; 438/455
(58) Field of Search ................................ 438/108, 612, 438/613, 614, 106, 455, 458, 459, 464, 50, 52, 599

(56) References Cited

U.S. PATENT DOCUMENTS

| | | | |
|---|---|---|---|
| 5,043,043 A | 8/1991 | Howe et al. | 156/654 |
| 5,206,983 A | 5/1993 | Guckel et al. | 29/598 |

(List continued on next page.)

FOREIGN PATENT DOCUMENTS

| | | | | |
|---|---|---|---|---|
| JP | 362299041 A | * | 12/1987 | |
| JP | 404107939 A | * | 4/1992 | |
| JP | 11145585 | | 5/1999 | ........... H01L/29/84 |
| JP | 200049357 | | 2/2000 | ........... H01L/29/84 |
| WO | WO9321536 | | 10/1993 | ........... G01P/15/08 |
| WO | WO9835258 | | 8/1998 | ........... G02B/26/08 |
| WO | WO9936941 | | 7/1999 | |

OTHER PUBLICATIONS

Storment, C., *Flexible, Dry–Released Process for Aluminum Electrostatic Actuators*, Sep. 1994, pp. 90–96.

(List continued on next page.)

*Primary Examiner*—Matthew Smith
*Assistant Examiner*—Chuong A Luu
(74) *Attorney, Agent, or Firm*—JDI Patent; Joshua D. Isenberg (57) ABSTRACT

A device having a landing pad structure on an underside of a device and method for fabricating same. The device is formed from a device layer with at least one landing pad protruding from an underside thereof. The landing pad is attached to the device layer by a plug passing through an opening in the device layer. The device may be attached to the device layer by one or more compliant flexures, which allow the device to rotate in and out of a plane defined by the device layer. The landing pads are fabricated by forming one or more vias through the device layer. An underlying sacrificial layer is then partially etched to form one or more depressions at locations corresponding to locations of the vias in the device layer. The vias and depressions are then filled with a landing pad material to form a structure having one or more landing pads protruding from an underside of the device layer. The sacrificial layer is subsequently removed to release the device. Particular embodiments of both methods may be applied to fabricating microelectromechanical systems (MEMS) especially MEMS mirrors. The various embodiments are well suited to use with silicon on insulator (SOI) substrates.

35 Claims, 10 Drawing Sheets

U.S. PATENT DOCUMENTS

| | | | | |
|---|---|---|---|---|
| 5,286,335 A | * | 2/1994 | Drabik et al. | 438/479 |
| 5,327,033 A | | 7/1994 | Guckel et al. | 310/40 |
| 5,453,405 A | * | 9/1995 | Fan et al. | 438/34 |
| 5,534,466 A | * | 7/1996 | Perfecto et al. | 216/20 |
| 5,549,785 A | * | 8/1996 | Sakai et al. | 438/52 |
| 5,587,343 A | * | 12/1996 | Kano et al. | 438/52 |
| 5,589,082 A | * | 12/1996 | Lin et al. | 216/2 |
| 5,637,539 A | | 6/1997 | Hofmann et al. | 438/20 |
| 5,638,946 A | | 6/1997 | Zavracky | 200/181 |
| 5,644,177 A | | 7/1997 | Guckel et al. | 310/40 |
| 5,645,684 A | | 7/1997 | Keller | 156/643.1 |
| 5,646,464 A | | 7/1997 | Sickafus | 310/40 |
| 5,662,771 A | | 9/1997 | Stouppe | 438/52 |
| 5,717,631 A | | 2/1998 | Carley et al. | 365/174 |
| 5,789,264 A | * | 8/1998 | Chung | 438/52 |
| 5,839,722 A | | 11/1998 | Berlin et al. | 271/265.02 |
| 5,842,106 A | | 11/1998 | Thaler et al. | 419/8 |
| 5,851,851 A | * | 12/1998 | Uenoyama et al. | 438/50 |
| 5,866,281 A | | 2/1999 | Guckel et al. | 430/22 |
| 5,867,202 A | | 2/1999 | Knipe et al. | 347/239 |
| 5,881,598 A | | 3/1999 | Sapuppo et al. | 74/5.6 |
| 5,908,719 A | | 6/1999 | Guckel et al. | 430/5 |
| 5,914,507 A | | 6/1999 | Polla et al. | 257/254 |
| 5,929,542 A | | 7/1999 | Ohnstein et al. | 310/40 |
| 5,943,155 A | | 8/1999 | Goossen et al. | 359/247 |
| 5,949,571 A | | 9/1999 | Goossen et al. | 359/291 |
| 5,959,338 A | | 9/1999 | Younger et al. | 257/419 |
| 5,963,788 A | | 10/1999 | Barron et al. | 438/48 |
| 5,971,355 A | | 10/1999 | Biegelsen et al. | 251/129.06 |
| 5,972,780 A | * | 10/1999 | Machida et al. | 438/455 |
| 6,028,331 A | | 2/2000 | Mastromatteo et al. | 257/253 |
| 6,078,100 A | | 6/2000 | Duesman et al. | 257/690 |
| 6,228,275 B1 | * | 5/2001 | Koch et al. | 216/2 |
| 6,238,946 B1 | * | 5/2001 | Ziegler | 438/50 |
| 6,265,781 B1 | | 7/2001 | Andreas | 257/765 |
| 6,287,885 B1 | * | 9/2001 | Muto et al. | 438/48 |
| 6,331,444 B1 | * | 12/2001 | Ferrari et al. | 438/52 |
| 6,388,279 B1 | * | 5/2002 | Sakai et al. | 257/254 |
| 6,417,021 B1 | * | 7/2002 | Vigna et al. | 438/53 |

OTHER PUBLICATIONS

Behrang Behin et al, Magnetically Actuated Micromirrors for Fiber–Optic Switching,Jun., 98. Solid–State Sensor and Actuator Workshop Hilton Head Island, South Carolina.pp 273–276.

Behrang Behin et al, Cantilevered Microstructure Methods and Apparatus, Feb. 23, 2000, p. 1–28. Application No. : 09/511,428.

* cited by examiner

MECHANICAL LANDING PAD FORMED ON THE UNDERSIDE OF A MEMS DEVICE

CROSS-REFERENCE TO RELATED APPLICATIONS

This application is a divisional of commonly assigned copending U.S. application Ser. No.: 09/546,432, which is incorporated herein by reference, and which is now U.S. Pat. No. 6,586,841B1

FIELD OF THE INVENTION

This invention relates generally microelectromechanical systems (MEMS). More particularly, forming landing pads on MEMS structures.

Background Art

Microelectromechanical systems (MEMS) are miniature mechanical devices manufactured using the techniques developed by the semiconductor industry for integrated circuit fabrication. Such techniques generally involve depositing layers of material that form the device, selectively etching features in the layer to shape the device and removing certain layers (known as sacrificial layers, to release the device. Such techniques have been used, for example, to fabricate miniature electric motors as described in U.S. Pat. No. 5,043,043.

Recently, MEMS devices have been developed for optical switching. Such systems typically include an array of mechanically actuatable mirrors that deflect light from one optical fiber to another. The mirrors are configured to translate or rotate into the path of the light from the fiber. Mirrors that rotate into the light path generally rotate about a substantially horizontal axis, i.e., they "flip up" from a horizontal position into a vertical position. MEMS mirrors of this type are usually actuated by magnetic interaction, electrostatic interaction, thermal actuation or some combination of these.

When the mirror is in the horizontal position, it rests against a substrate that forms a base. Often, the mirror is subject to electromechanical forces, sometimes referred to as "stiction" that cause the mirror to stick to the substrate and prevent the mirror from rotating. The same stiction forces can also prevent the mirror from being properly released from the substrate during manufacture. To overcome stiction problems, landing pads (also called dimples or bumps have been used extensively in MEMS devices to minimize or otherwise control the contact area between the device and the underlying substrate. In the prior art, such landing pads are formed prior to deposition of a device layer either by etching pits in an underlying sacrificial layer or by depositing pads of another material prior to the deposition of the layer forming the device.

Recently, silicon on insulator (SOI) techniques have been developed for fabricating MEMS devices. In SOI, an oxide layer is grown or deposited on a silicon wafer. A second silicon wafer is then bonded to the oxide layer, e.g. by plasma bonding. After bonding, the second silicon wafer is cleaved such that a thin layer of silicon is left attached to the oxide layer to form an SOI substrate. However, when that thin silicon layer is a MEMS device layer it is generally not possible to process the underside of the device layer prior to bonding the device layer to the oxide layer. Any processing of the device layer must therefore be done after it is attached to the underlying substrate. However since the underside of the device layer is firmly attached to the oxide layer it is not normally possible to deposit material on or etch material from the underside of the device layer. Currently, no technology exists for forming pads on the underside of the device layer of a MEMS device fabricated using SOI.

There is a need, therefore, for an SOI MEMS device having landing pads on an underside of the device layer and a method of fabricating same.

OBJECTS AND ADVANTAGES

Accordingly, it is a primary object of the present invention to provide a controlled landing pad between a device layer and a substrate. It is a further object of the invention to control the material and shape of such a landing surface. It is an additional object of the invention to provide a method for fabricating such landing pads that is consistent with SOI fabrication techniques.

SUMMARY

These objects and advantages are attained by a method for fabricating a landing pad structure on an underside of a device. The method comprises providing a substrate having a sacrificial layer disposed between a base layer and a device layer. One or more vias are etched through the device layer. The sacrificial layer is then partially etched to form one or more depressions in the sacrificial layer at locations corresponding to locations of the vias in the device layer. The vias and depressions are then filled with a landing pad material to form a structure having one or more landing pads protruding from an underside of the device layer. The sacrificial layer is subsequently removed to release the structure. Particular embodiments of both methods may be applied to fabricating microelectromechanical systems (MEMS) especially MEMS mirrors. In an alternative embodiment of the invention, the device layer is bonded to the sacrificial layer after forming the depressions in the sacrificial layer.

The various embodiments of the present invention produce an inventive device having a device layer with at least one landing pad on an underside of the device layer attached to the device layer by a plug passing through an opening in the device layer. The device may be attached to the device layer by one or more compliant flexures, which allow the device to rotate in and out of a plane defined by the device layer.

The various embodiments are well suited to use with silicon on insulator substrates since the patterning of a sacrificial oxide layer may be performed either before or after bonding the device layer to the rest of the substrate.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

Figure 1A:
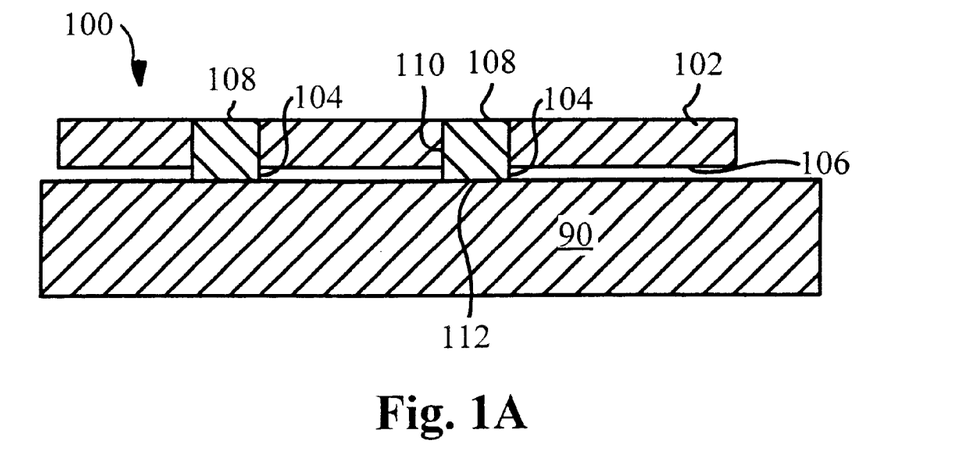
FIG. 1A depicts a landing pad structure according to a first embodiment of the present invention.
Figure 1B:
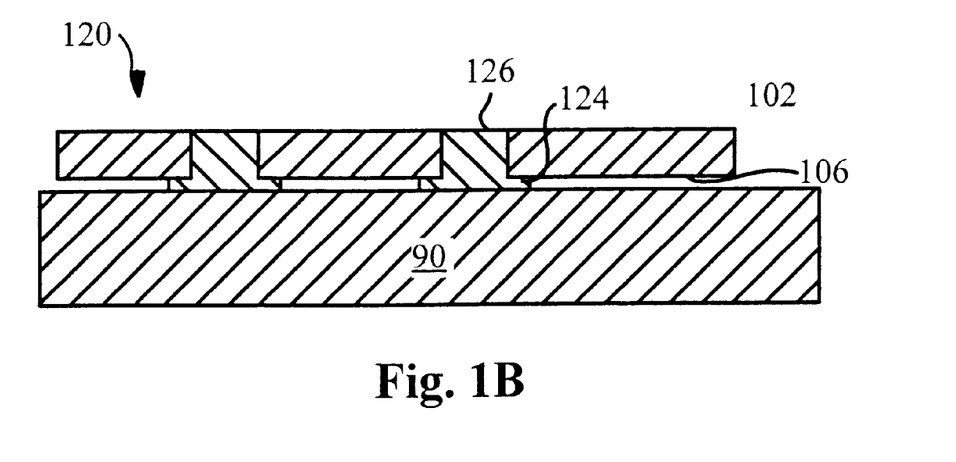
FIG. 1B depicts a landing pad structure according to a second embodiment of the present invention.
Figure 1C:
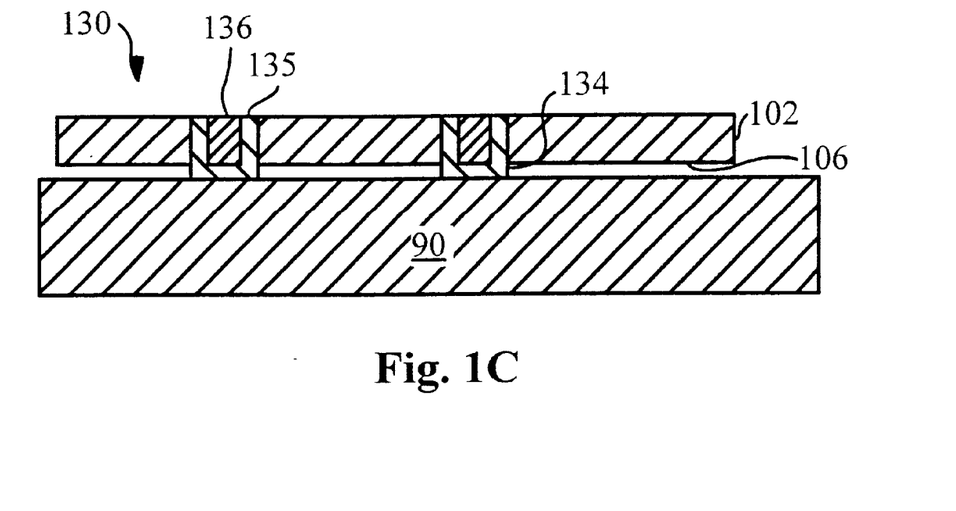
FIG. 1C depicts a multilayer landing pad structure according to a third embodiment of the present invention.

Variations on a device with the inventive landing pad structure are depicted in FIGS. 1A–1C., In a first embodiment of the invention, depicted in FIG. 1A, a basic device 100 includes a device layer 102 and at least one landing pad 104 protruding from an underside 106 of device layer 102. Landing pad 104 is attached to device layer 102 by a plug 108 passing through an opening 110 in device layer 102. The landing pad provides a smaller contact area 112 than an area of underside 106. The smaller contact area serves to reduce stiction between device 100 and an underlying substrate 90. Stiction may also be reduced by proper choice of the material comprising landing pad 104.

Device 100 may be any type of electromechanical device. Suitable devices include side-actuated motors, and electromagnetically or thermally actuatable mirrors for optical switches. Device layer 102 is typically a semiconductor material such as silicon, although other possible materials including metals and dielectrics may also be used.

Depending on the specific application, landing pad 104 may be made from a dielectric material, such as silicon nitride, or a metal, such as Tungsten, titanium nitride or the like. Alternatively the landing pad may be made from polycrystalline silicon or other similar material.

Two variations on the basic device 100 are depicted in FIGS. 1B and 1C. FIG. 1B depicts a second embodiment of the invention. The basic structure of the device in this embodiment shares features in common with device 100 of FIG. 1A. In the second embodiment, a device 120 includes at least one landing pad 124 having a diameter greater than a plug 126. This type of device can be fabricated using wet processing, which is a lower cost process than dry processing. FIG. 1C depicts a third embodiment, in which a device 130 includes at least one landing pad 134 comprised of two or more separate layers 135 and 136. Generally, layers 135 and 136 are made from different materials. For example, layer 135, which contacts substrate 112, may be a dielectric layer. For example, layer 136, may be a conductive material, which is part of an electrode structure. Layer 135 insulates layer 136 from electrical contact with substrate 112.

Figure 2A:
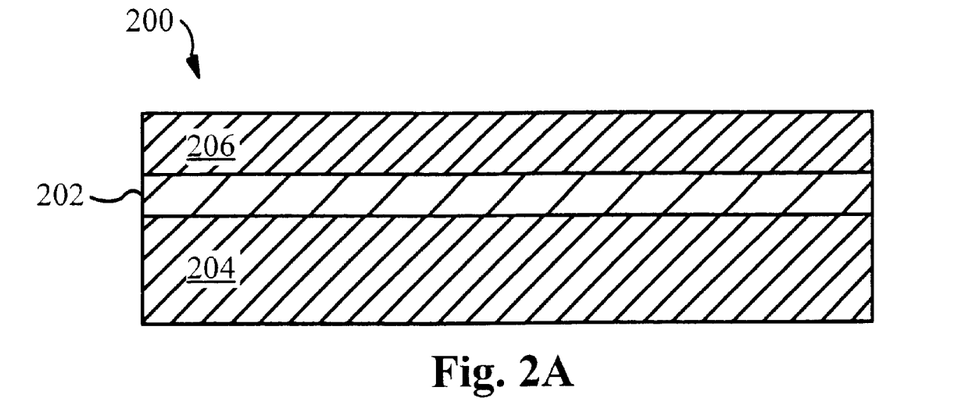
FIGS. 2A–2E depict fabrication of a device according to a fourth embodiment of the present invention.

The devices depicted in FIGS. 1A–1C may be fabricated by an inventive method according to a fourth embodiment of the invention. The basic steps of the method are depicted in FIGS. 2A–2E. FIG. 2A depicts the basic substrate 200 from which the device is made. Substrate 200 generally includes a sacrificial layer 202 disposed between a base layer 204 and a device layer 206. The substrate may be formed by a silicon on insulator (SOI) fabrication process. When an SOI substrate is used, sacrificial layer 202 is typically an oxide formed by oxidizing a silicon base layer 204. Such a structure is sometimes referred to as silicon on oxide (SOI). Alternatively, sacrificial layer 202 may be a nitride layer, in which case the structure is sometimes referred to as silicon on nitride. Other possible configurations for substrate 200 include silicon on polymer, glass on silicon, glass on nitride and other multiple-layer substrates.

Figure 2B:
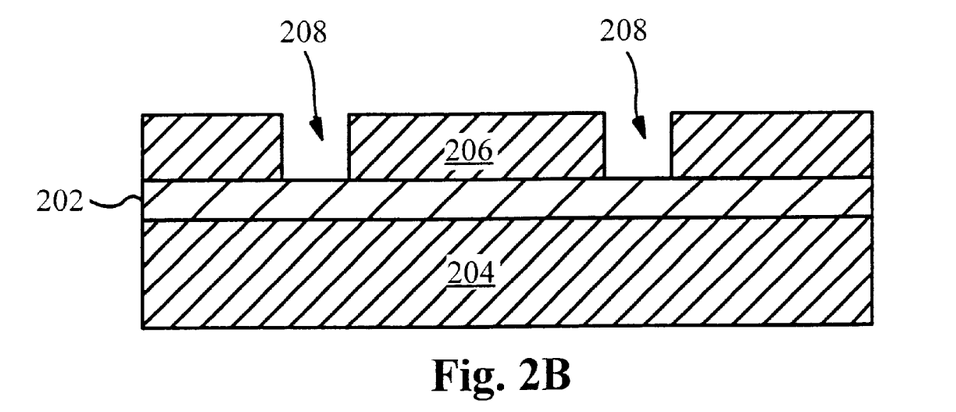

Next one or more vias 208 are formed through device layer 206 all the way to sacrificial layer 202 as shown in FIG. 2B. Vias 208 may be formed in device layer 206 by dry etch processes, such as reactive ion etching (RIE) or wet etch processes, e.g., anisotropic etching of Si with KOH. In such etch processes, sacrificial layer 202 often resists attack by etchants used to form vias 208 and therefore acts as an etch stop. Alternatively, vias 208 may be laser drilled or formed by local oxidation (LOCOS) and oxide etch.

Figure 2C:
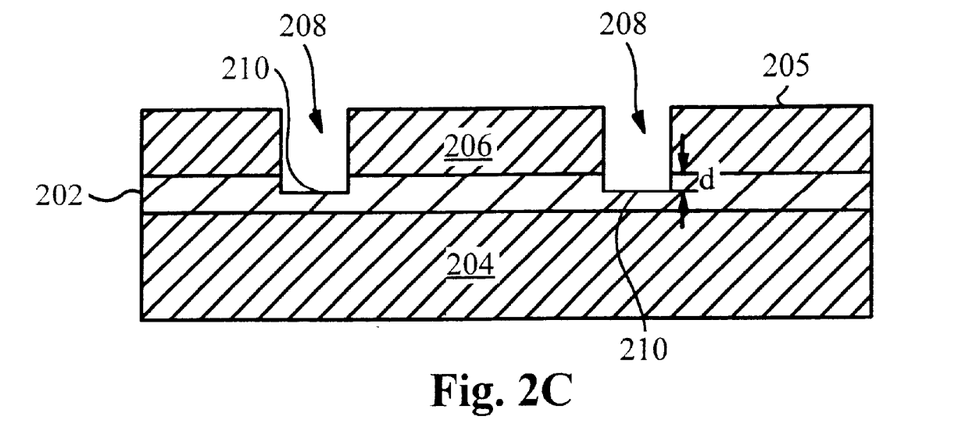

After vias 208 have been formed in device layer 206 sacrificial layer 202 is partially etched as shown in FIG. 2C. The etching of sacrificial layer 202 forms one or more depressions 210 having a depth d at locations corresponding to locations of vias in the device layer. A different etch process than that used to form vias 208 may be used to form depressions 210. By whatever process they are formed, depressions 210 do not penetrate all the way through to base layer 204. In other words the depth d of the depressions is less than the thickness t of sacrificial layer 202.

Figure 2D:
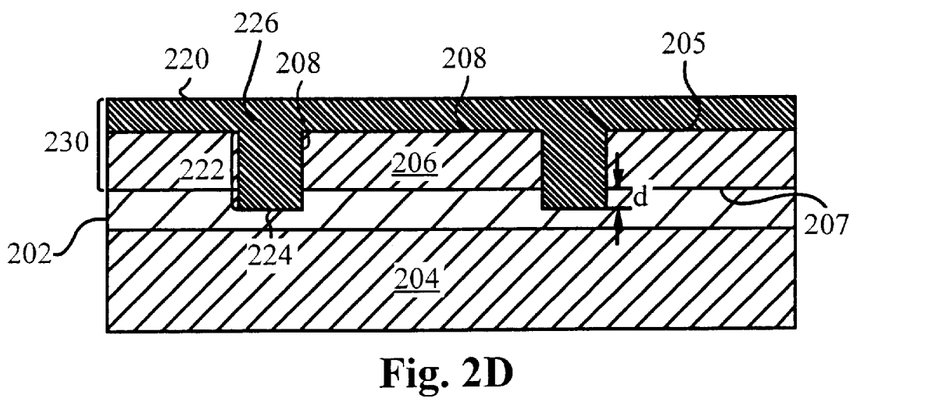

After forming depressions 210, vias 208 and depressions 210 are filled with a layer landing pad material 220 as shown in FIG. 2D. Layer 220 may optionally be planarized down to a top surface 205 of device layer 206, e.g. by chemical mechanical polishing (CMP). Filling depressions 210 and vias 208 forms a structure 222 having one or more landing pads 224 protruding from an underside 207 of device layer 206. Each landing pad 224 is connected to structure 220 by a plug 226 of material that fills via 208. The depth d of depressions 210 determines the thickness of landing pads 224. If depressions 210 are formed such that they undercut device layer 206, e.g., by isotropic etching. Landing pad 224 can have a larger diameter than a diameter of plug 226 resulting in a landing pad structure similar to that shown in FIG. 1B. The landing pad structure shown in FIG. 1C may be fabricated by partially etching plugs 226 and filling the resulting void with a layer of material. In a particular embodiment landing pad material 220 is deposited inside vias 208 to a thickness of at least one-half the diameter of a widest via 208 to ensure that the landing pad material 220 plugs the vias.

Figure 2E:
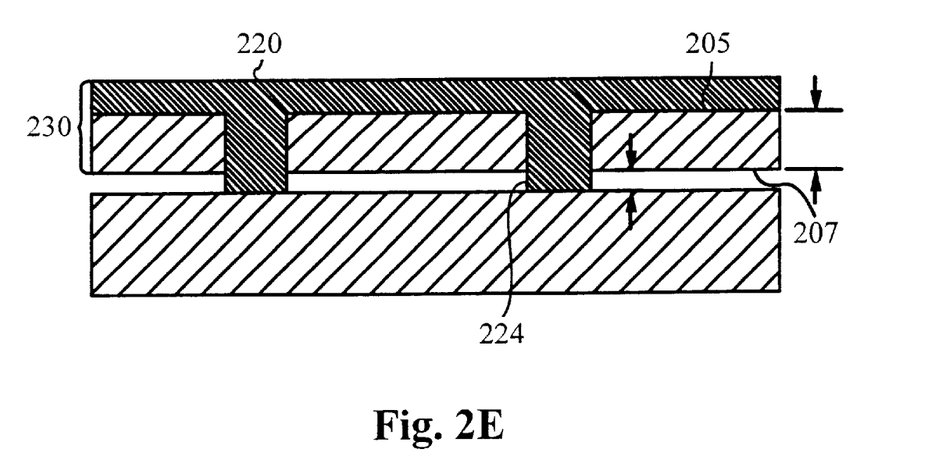

Pad material layer 220 and device layer 206 generally comprise a device 230. After landing pad material 220 has been deposited, sacrificial layer 202 is removed to release device 230 as shown in FIG. 2E. Sacrificial layer 202 may be removed by any suitable method, such as wet etch or other isotropic etch process.

Figure 3A:
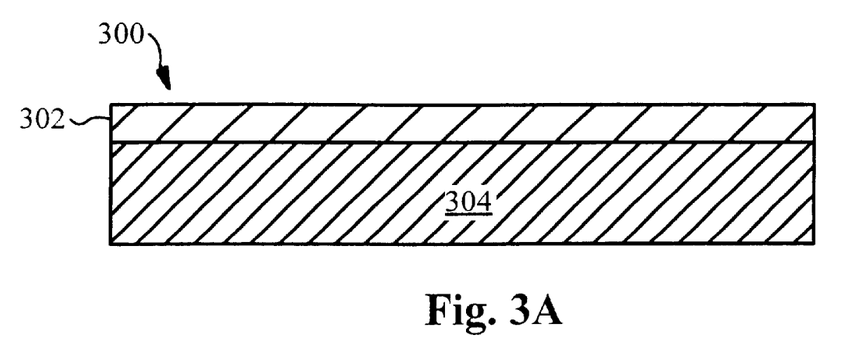
FIGS. 3A–3F depict fabrication of a device according to a fifth embodiment of the present invention.

Devices of the type shown in FIGS. 1A–1C may alternatively be fabricated by a method according to a fifth embodiment of the invention. The basic steps of the method are depicted in FIGS. 3A–3E. FIG. 3A depicts a basic substrate 300 from which the device is made. Substrate 300 generally includes a sacrificial layer 302 disposed on top of a base layer 304. Substrate 300 may be formed by a silicon-on-insulator (SOI) fabrication process, e.g. by oxidizing a silicon base layer 304. Alternatively, an oxide or nitride layer may be deposited on top of base layer 304. Other possible configurations for substrate 300 include silicon on polymer, glass on silicon, glass on nitride and the like.

Figure 3B:
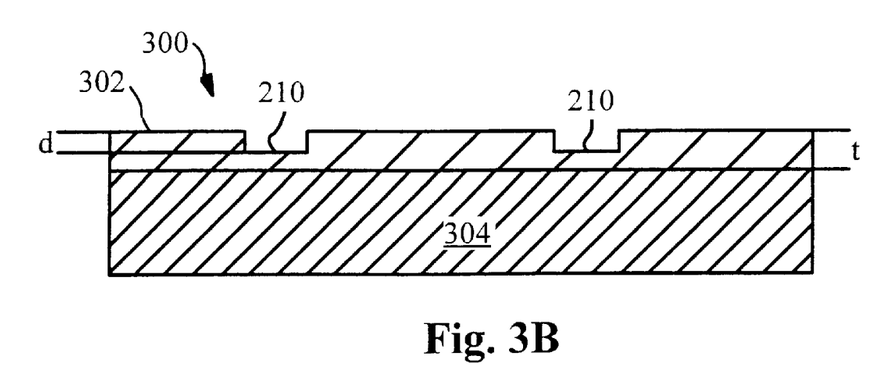

Next sacrificial layer 302 is partially etched to form one or more depressions 310 as shown in FIG. 3B. Depressions 310 having a depth d that is less than the thickness t of sacrificial layer 302.

Figure 3C:
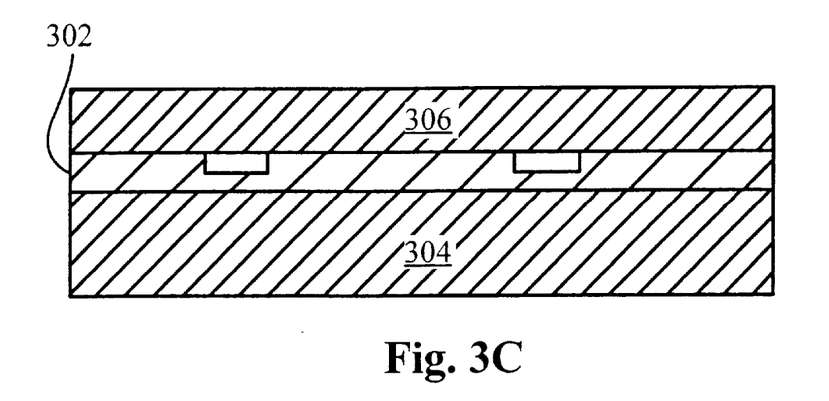

After depressions 310 have been formed, a device layer 306 is bonded to sacrificial layer 302 as shown in FIG. 3C. Device layer 306 may be any suitable material depending on the desired application. In a specific embodiment, device layer 306 is a layer of silicon.

Figure 3D:
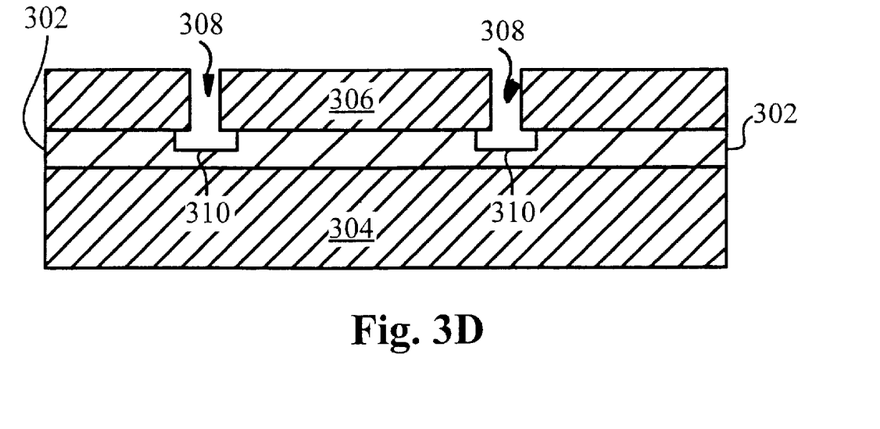

Next one or more vias 308 are formed through device layer 306 all the way through to depressions 310 in sacrificial layer 302 as shown in FIG. 3D. Vias 308 may be formed in device layer 306 by dry etch processes, such as reactive ion etching (RIE) or wet etch processes, e.g., anisotropic etching of Si with KOH as described above. Alternatively, vias 308 may be laser drilled or formed by local oxidation (LOCOS) and oxide etch. In the exemplary embodiment shown, depressions 310 have a diameter that is greater than a diameter of vias 308. Alternatively, the diameter of depressions 310 may be the same as or smaller than the diameter of vias 308.

Figure 3E:
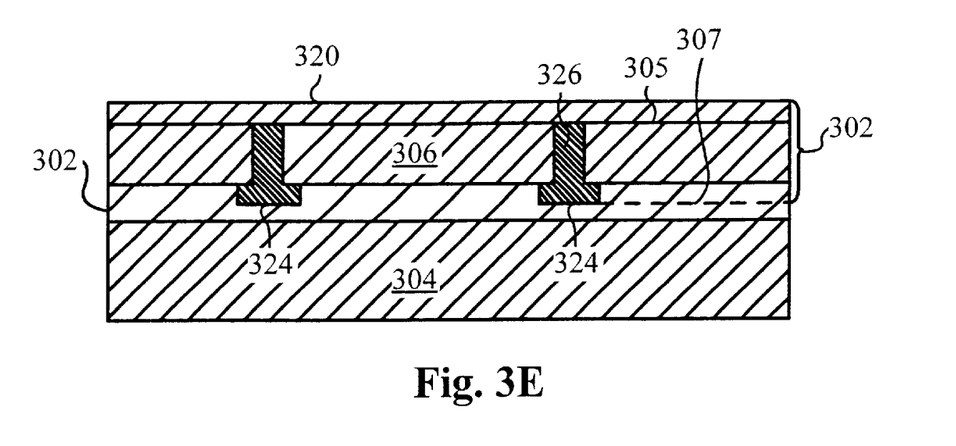

After vias 308 have been formed in device layer 306, vias 308 and depressions 310 are filled with a layer landing pad material 320 as shown in FIG. 3E. Layer 320 may optionally be planarized down to a top surface 305 of device layer 306, e.g. by chemical mechanical polishing (CMP). Filling depressions 310 and vias 308 forms a structure having one or more landing pads 324 protruding from an underside 307 of device layer 306. Each landing pad 324 is connected to the structure by a plug 326 of material that fills via 308. The depth d of depressions 310 determines the thickness of landing pads 324. Because depressions 310 have larger diameters that vias 308, landing pads 324 have a larger diameter than plugs 326 resulting in a landing pad structure similar to that shown in FIG. 1B.

Figure 3F:
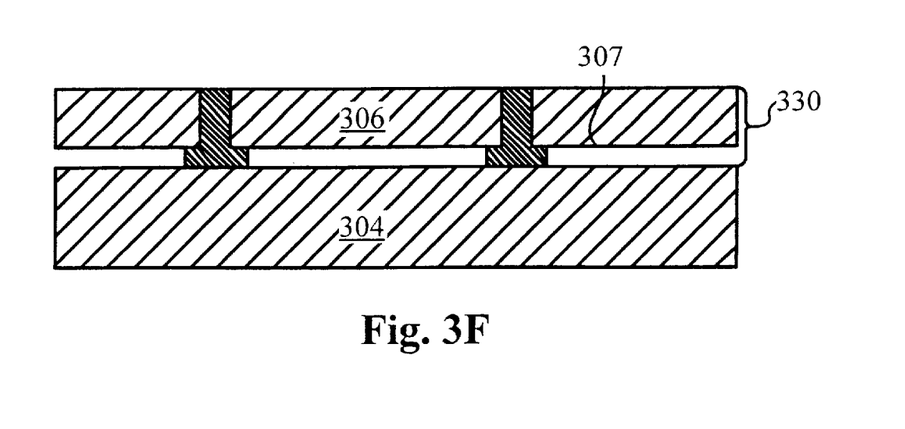

Pad material layer 320 and device layer 306 generally comprise a device 330. After landing pad material 320 has been deposited, sacrificial layer 302 is removed to release device 330 as shown in FIG. 3F. Sacrificial layer 302 may be removed by any suitable method, such as wet etch or other isotropic etch process.

Figure 4A:
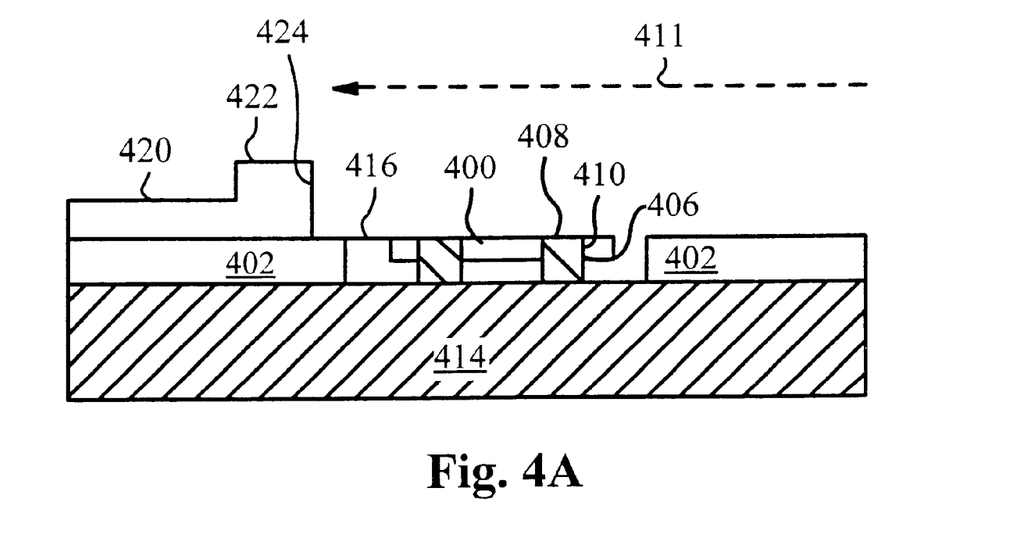
FIGS. 4A–4B depicts a microelectromechanical mirror element according to a sixth embodiment of the present invention.

A sixth embodiment of the present invention includes an electromechanically actuatable mirror element of a type used in optical fiber switching arrays. Micromechanical elements are described in U.S. patent application Ser. No. 09/511,428 to Berhang Behin, Kam Lau and Richard Muller, filed Feb. 23, 2000, and titled "Cantilevered Microstructure Methods and Apparatus" which is incorporated herein by reference. An exemplary embodiment of such a mirror element 400 according the present invention is depicted in FIG. 4A. Mirror element 400 generally is formed from a device layer 402 as described above with respect to FIGS. 2A–2E or 3A–3F. At least one landing pad 404 protrudes from an underside 406 of mirror element 400. Landing pad 404 is attached to mirror element 400 by a plug 408 passing through an opening 410 in mirror element 400. Landing pad 404 provides a smaller contact area 412 that serves to reduce stiction between mirror element 400 and an underlying substrate 414. Stiction may also be reduced by proper choice of the material comprising landing pad 404.

Figure 4B:
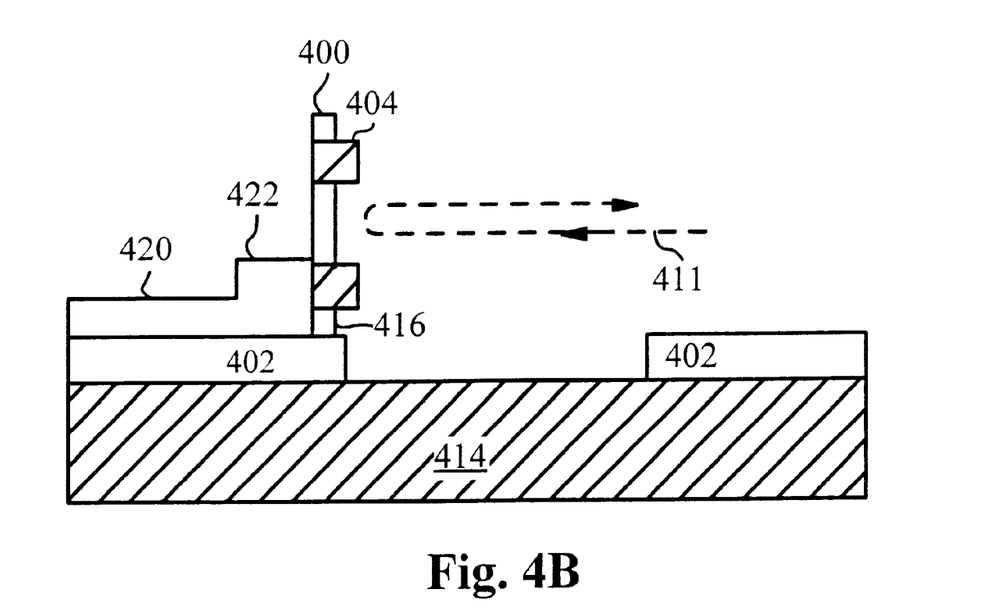

Mirror element 400 may be attached to mirror layer 402 via one or more compliant flexures 416. Such a mirror element can be actuated between an 'on' position, at which it intercepts an optical beam 411 as shown in FIG. 4B, and an 'off' position, at which it allows optical beam 411 to pass as shown in FIG. 4A. A second chip 420 containing vertical sidewall 422 may be positioned on top of the chip containing mirror 400, so that when flipped vertically by application of a magnetic field, mirror 400 can be pulled in to the sidewall by application of an electrostatic force. Electrostatic clamping to a precise vertical clamping surface 424 on a sidewall 426 defines the mirror position accurately and reproducibly when it is in the 'on' position. To ensure that all mirrors in an array have the same 'on' angle, the clamping surfaces for different mirrors may be constructed at the same angle on a single substrate. This provides a global mechanical positioning mechanism for a field of actuated mirrors.

Mirror element 400 and the clamping surfaces are typically constructed from electrically conductive material. Landing pads 404 made of an insulating material may prevent electrical contact between the mirrors and the clamping surfaces when the two conductive surfaces are brought together.

Flexures 416 allow mirror element 400 to rotate out of a plane defined by mirror layer 402 as shown in FIG. 4B. Mirror actuation may be performed by applying an external magnetic field that interacts with a magnetic material on the mirror element 400. Lateral compliance of the torsional flexures 416 reduces the electric field necessary to pull the mirror to sidewall 422, and allows mirror element 400 to make contact with sidewall 422 at three or more points when sufficient electrostatic field is applied. After mirror element 400 is electrostatically clamped to sidewall 422, the magnetic field can be switched on and off without affecting the mirror position. Once the electrostatic field is turned off, torsional flexures 416 pull mirror element 400 back to its horizontal position by torsional flexures 416. A horizontal magnetic field may also be employed to aid in actuating mirror element 400 back to the horizontal position.

Mirror 400, in the horizontal position, can be clamped electrostatically to substrate 414 to prevent it from responding to an external field. Selective electrostatic clamping of mirrors in both the vertical and horizontal positions allows individual addressing of mirrors belonging to an array and subject to the same external magnetic field.

Mirror 400 and the top chip 420 may be fabricated by silicon microfabrication techniques such as polycrystalline-silicon surface-micromachining process. The top chip 420 containing the sidewalls 422 may be fabricated by anisotropic etching of (110)-oriented Si. Such a method ensures angular uniformity of the sidewalls over the area of the top chip. Furthermore, mirror 400 may be fabricated from a silicon on insulator (SOI) substrate by either of the two methods described above.

Figure 5A:
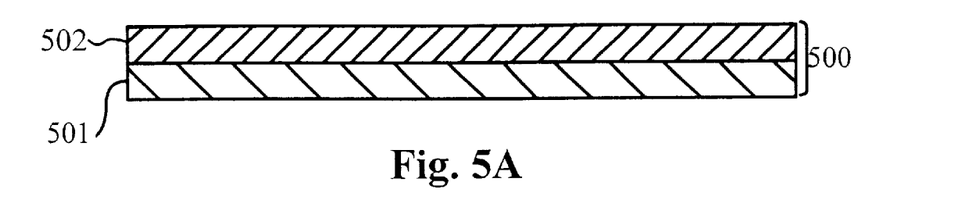
FIGS. 5A–5F depict fabrication of a device according to a seventh embodiment of the present invention.

Devices of the type shown in FIGS. 1A–1C and 4 may alternatively be fabricated by a method according to a seventh embodiment of the invention. The basic steps of the method are depicted in FIGS. 5A–5F. FIG. 5A depicts a substrate 500 from which the device is made. Substrate 500 generally comprises a device layer 501 and a landing pad material layer 502. Device layer 501 may be any suitable material depending on the desired application. In a specific embodiment, device layer 501 is a layer of silicon. Landing-pad material layer 502 may be deposited or formed on a surface of device layer 501 by any conventional means.

Figure 5B:
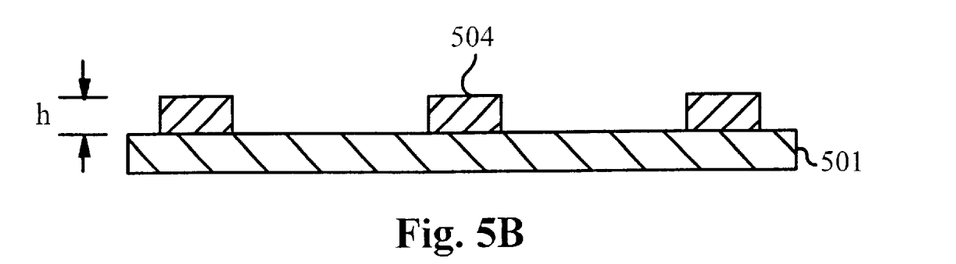

Next landing-pad material layer 502 is partially etched to form one or more landing pads 504 having a height h as shown in FIG. 5B. Landing pads 504 may be formed by any suitable technique such as reactive ion etching (RIE) or wet etch processes, e.g., anisotropic etching of silicon with KOH as described above. Alternatively, landing pads 504 may be ion milled or formed by local oxidation (LOCOS) and oxide etch.

Figure 5C:
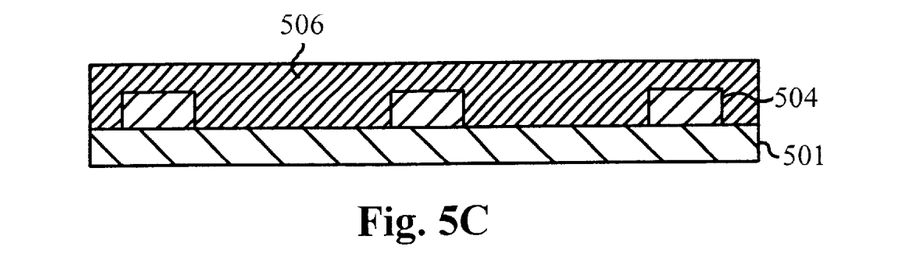

Next, a sacrificial layer 506 is deposited over landing pads and substrate 500 as shown in FIG. 5C. Typically, sacrificial layer 506 includes an oxide. Alternative sacrificial layers include nitrides, glasses and polymers. Sacrificial layer 506 is typically planarized, e.g. by CMP to a thickness t. Preferably, height h of landing pads 504 is less than thickness t of sacrificial layer 506 so that landing pads 504 are not exposed. If the landing pads 504 may have different heights t is preferably greater than the height of the tallest landing pad.

Figure 5D:
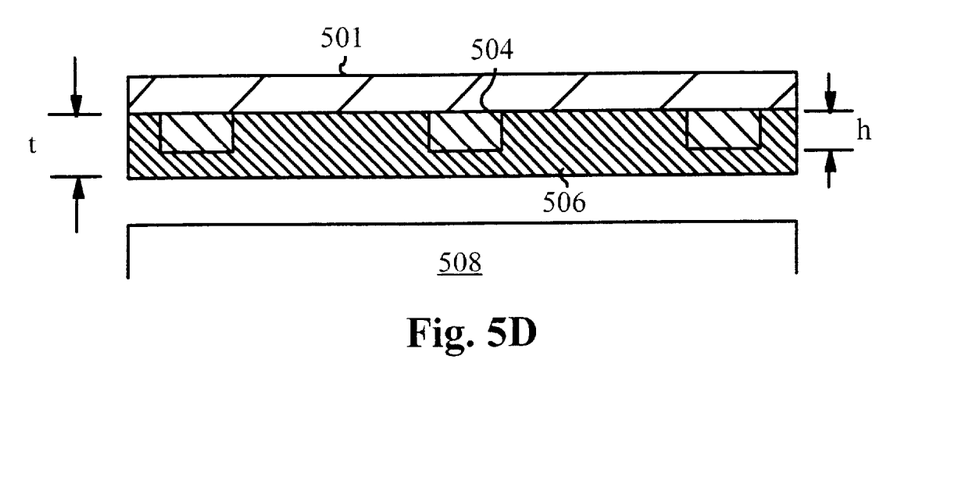
Figure 5E:
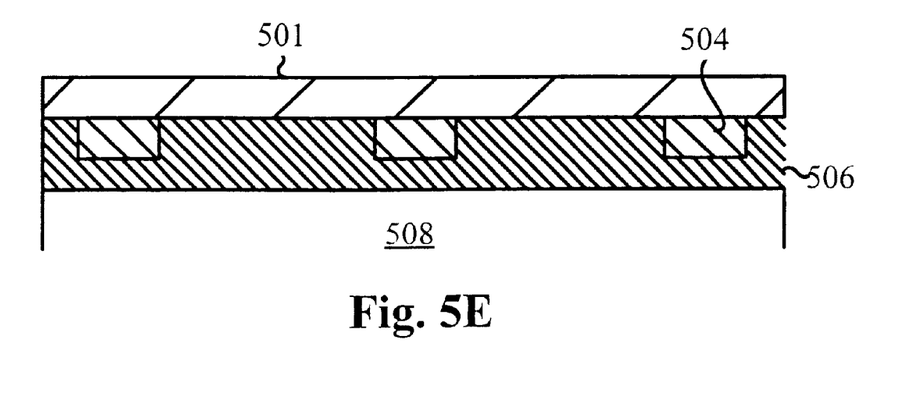

After sacrificial layer 506 has been planarized, substrate 500 may be inverted so that sacrificial layer 506 faces a base layer 508 as shown in FIG. 5D. As a result of this step, landing-pads 504 protrude from an underside 509 of substrate 500. Next, substrate 500 is bonded to base layer 508 via sacrificial layer 506 as shown in FIG. 5E.

Figure 5F:
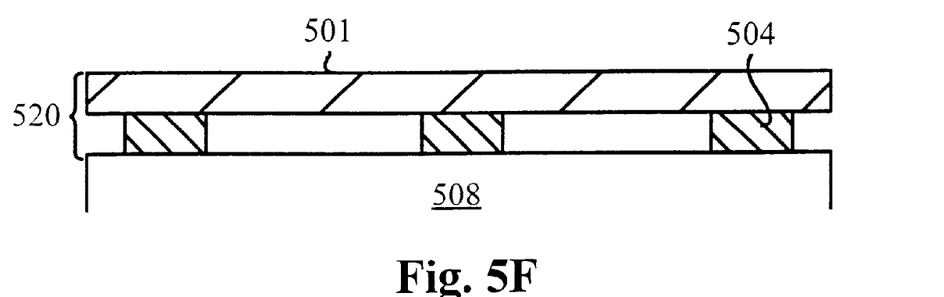

Device layer 501 and landing pads 504 generally comprise a device 520, which may be released by removing sacrificial layer 506 as shown in FIG. 5F. Sacrificial layer 506 may be removed by any suitable method, such as wet etch or other isotropic etch process.

Figure 6A:
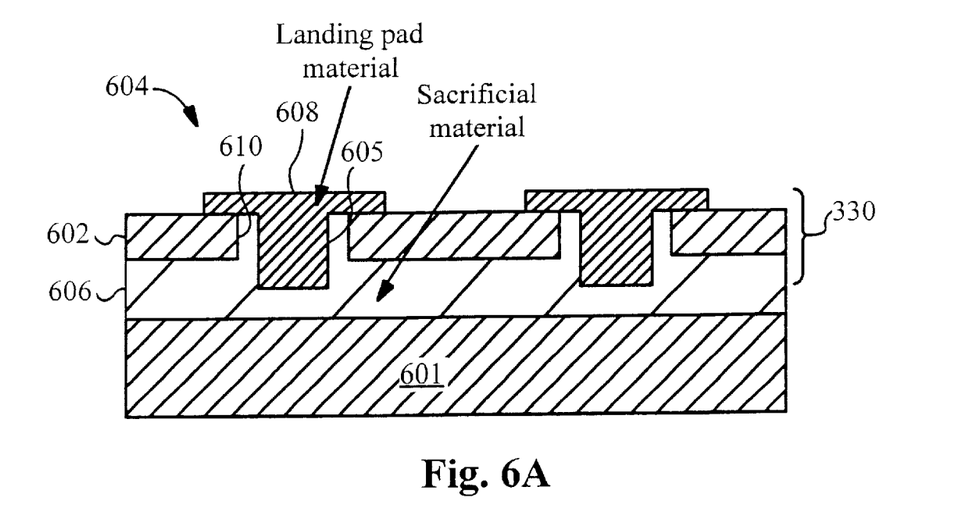
FIGS. 6A–6B depict fabrication of a device according to an eighth embodiment of the present invention.
Figure 6B:
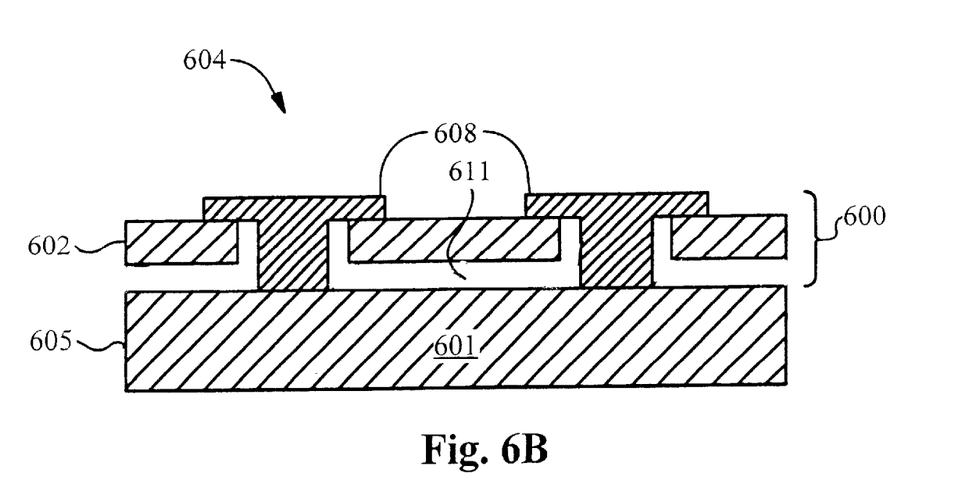

Other variations on the above described devices and fabrication methods are possible. For example, in an eighth embodiment, any of the above-described fabrication methods may be used to fabricate a device having landing pads with "air-spaced" standoffs. The device 600, depicted in FIGS. 6A–6B, includes a device layer 602 and at least one landing pad 604 protruding from an underside 606 of device layer 602. Landing pad 604 has a plug 605 that protrudes through an opening 610 in device layer 602. Landing pad 604 is attached to device layer 602 by a flange 608. The landing pad 604 provides a smaller contact area 612 than an area of underside 606. Plug 605 generally has a diameter that is smaller than a diameter of opening 610. This configuration produces a gap 611 between plug 605 and device layer 602. The resulting structure provides an air-spaced standoff. Flanges 610 on neighboring landing pads 604 may be isolated from each other as shown in FIGS. 6A–6B. Alternatively, neighboring landing pads 604 may protrude from a common layer of landing pad material.

Device 600 may be manufactured on a substrate 601 according to any of the methods described above. For example, FIG. 6A depicts the device 600 prior to removal of a sacrificial layer 620. FIG. 6B depicts the device 600 after removal of a sacrificial layer 620.

Figure 7A:
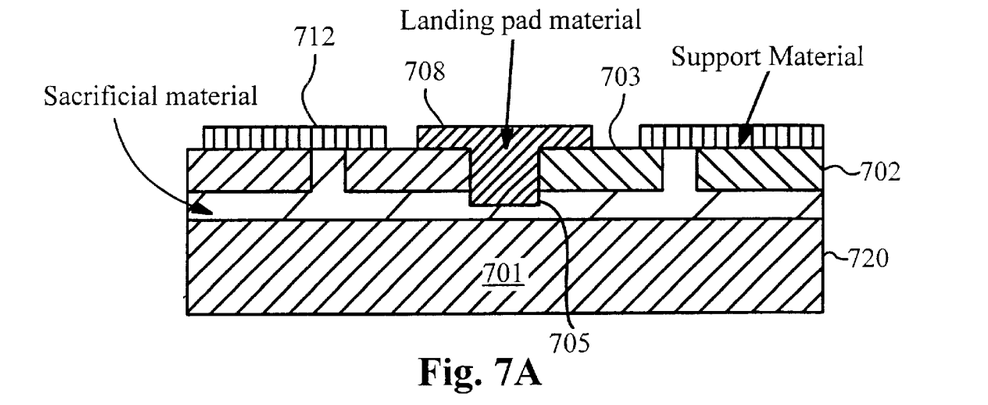
FIGS. 7A–7B depict fabrication of a device according to a ninth embodiment of the present invention.
Figure 7B:
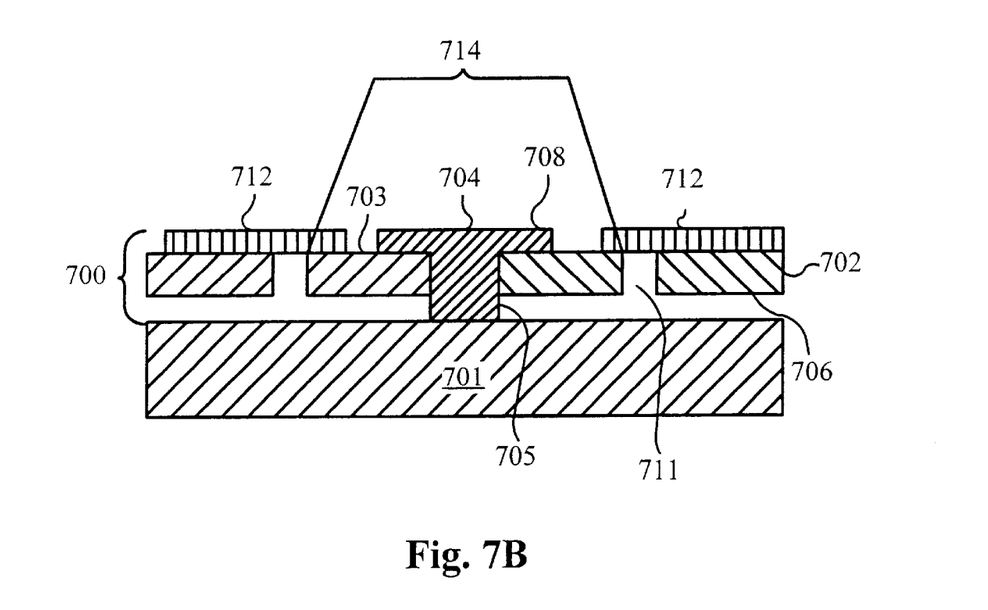

In a ninth embodiment of the invention, a device 700 may be manufactured with one or more standoffs separated from the rest of the device layer as depicted in FIGS. 7A–7B. The device 700 is typically manufactured on a substrate 701 having a sacrificial layer 720 as shown in FIG. 7A. The device 700 includes a device layer 702 and at least one landing pad 704 protruding from an underside 706 of device layer 702. Landing pad 704 has a plug 705 that protrudes through an opening 710 in a standoff region 703 of device layer 702. Landing pad 704 is attached to standoff region 703 by a flange 708. One or more trenches 710 formed in device layer 702 separate standoff region 703 from the rest of device layer 702. During fabrication, sacrificial layer 720 mechanically supports device layer 702, standoff region 703 and landing pad 704. A layer of support material 712, formed over trenches 710 provides a connection between standoff region 703 and the rest of device layer 702. Standoff region 703 and landing pad 704 form a separated standoff 714 when sacrificial layer 720 is removed, as shown in FIG. 7B. Support material 712 provides a mechanical structural support for standoff 714 and device layer 702 after sacrificial layer 720 is removed. Such a configuration is useful, for example, in applications where it is desirable to electrically isolate standoff 714 from device layer 702.

It will be clear to one skilled in the art that the above embodiments may be altered in many ways without departing from the scope of the invention. Accordingly, the scope of the invention should be determined by the following claims and their legal equivalents.

What is claimed is:

1. A method for fabricating a landing pad structure, on an underside of a device comprising:

a) providing a substrate having a sacrificial layer disposed between a base layer and a device layer;

b) etching one or more vias through the device layer;

c) partially etching the sacrificial layer at locations corresponding to locations of the vias in the device layer to form one or more depressions in the sacrificial layer;

d) filling the vias and the depressions with a landing pad material to form a structure having one or more landing pads protruding from an underside of the device layer; and e) removing the sacrificial layer to release the structure.

2. The method of claim 1 wherein the substrate is a silicon on insulator substrate.

3. The method of claim 1 wherein the sacrificial layer includes an oxide.

4. The method of claim 1 wherein the landing pad material comprises two or more layers of different materials.

5. The method of claim 1 wherein b) is performed prior to c).

6. The method of claim 1 wherein c) is performed prior to b).

7. The method of claim 6 wherein a) includes bonding the device layer to the sacrificial layer after step c).

8. The method of claim 6 wherein at least one of the depressions has a diameter larger than a diameter a corresponding via.

9. The method of claim 1 further comprising after c) and prior to d) depositing a sacrificial material into the vias and depressions.

10. The method of claim 1 wherein the landing pad comprises a plug that protrudes through the via.

11. The method of claim 10 wherein the plug is attached to a flange.

12. The method of claim 11 wherein the plug is separated from the device layer by a gap.

13. The method of claim 1 wherein a standoff region of the device layer adjacent the landing pad is separated from a remainder of the device layer such that the standoff region and the landing pad form a separated standoff.

14. The method of claim 13 wherein the standoff is mechanically connected to the device layer by a support layer.

15. The method of claim 1 wherein the landing pad material is deposited inside the vias to a thickness of at least one-half the diameter of a widest via, thereby plugging the vias.

16. A method for fabricating a micro-electromechanical mirror, comprising:

a) providing a substrate having a sacrificial layer disposed between a base layer and a device layer;

b) etching one or more vias through the device layer;

c) partially etching the sacrificial layer at locations corresponding to locations of the vias in the device layer to form one or more depressions in the sacrificial layer;

d) filling vias and the depressions with a landing pad material to form a mirror having one or more landing pads protruding from an underside of the mirror; and e) removing the sacrificial layer to release the mirror.

17. The method of claim 16 wherein the landing pad material comprises two or more layers of different materials.

18. The method of claim 16 wherein b) is performed prior to c).

19. The method of claim 16 wherein c) is performed prior to b).

20. The method of claim 19 wherein a) includes bonding the device layer to the sacrificial layer after step c).

21. The method of claim 19 wherein at least one of the depressions has a diameter larger than a diameter a corresponding via.

22. The method of claim 16 wherein the landing pad comprises a plug that protrudes through the via.

23. The method of claim 22 wherein the plug is attached to a flange.

24. The method of claim 22 wherein the plug is separated from the device layer by a gap.

25. The method of claim 16 wherein a standoff region of the device layer adjacent to the landing pad is separated from a remainder of the device layer such that the standoff region and the landing pad form a separated standoff.

26. The method of claim 25 wherein the standoff is mechanically connected to the device layer by a support layer.

27. A method for fabricating a landing pad structure, on an underside of a device comprising:
   a) providing a substrate having a device layer;
   b) depositing a layer of landing pad material on the device layer;
   c) etching the landing pad material to form one or more landing pads;
   d) depositing a sacrificial layer over the landing pads and the device layer;
   e) bonding the sacrificial layer to a base layer and
   f) removing the sacrificial layer to release the device.

28. The method of claim 27 further comprising inverting the substrate between steps d) and e).

29. The method of claim 27 wherein a thickness of the sacrificial layer is greater than a height of a tallest of the landing pads.

30. The method of claim 27, wherein the sacrificial material includes an oxide.

31. The method of claim 27 wherein the landing pad comprises a plug that protrudes through the via.

32. The method of claim 31 wherein the plug is attached to a flange.

33. The method of claim 31 wherein the plug is separated from the device layer by a gap.

34. The method of claim 27 wherein a standoff region of the device layer adjacent to the landing pad is separated from a remainder of the device layer such that the standoff region and the landing pad form a separated standoff.

35. The method of claim 34 wherein the standoff is mechanically connected to the device layer by a support layer.

* * * * *